United States Patent
Bell et al.

(10) Patent No.: US 8,508,052 B2
(45) Date of Patent: Aug. 13, 2013

(54) STACKED POWER CONVERTER STRUCTURE AND METHOD

(75) Inventors: David B. Bell, Los Altos Hills, CA (US); Francois Hebert, San Mateo, CA (US); Nikhil Kelkar, Saratoga, CA (US)

(73) Assignee: Intersil Americas Inc., Milpitas, CA (US)

( * ) Notice: Subject to any disclaimer, the term of this patent is extended or adjusted under 35 U.S.C. 154(b) by 11 days.

(21) Appl. No.: 13/048,165

(22) Filed: Mar. 15, 2011

(65) Prior Publication Data
US 2011/0163434 A1 Jul. 7, 2011

Related U.S. Application Data

(62) Division of application No. 12/477,818, filed on Jun. 3, 2009, now Pat. No. 7,923,300.

(60) Provisional application No. 61/162,232, filed on Mar. 20, 2009, provisional application No. 61/140,610, filed on Dec. 23, 2008.

(51) Int. Cl.
*H01L 23/538* (2006.01)
*H01L 23/34* (2006.01)
*H01L 23/48* (2006.01)
*H01L 23/488* (2006.01)

(52) U.S. Cl.
USPC .......................... 257/777; 257/337; 257/481

(58) Field of Classification Search
USPC .................. 257/675, E21.506, E23.031, 777, 257/337, 481; 438/122
See application file for complete search history.

(56) References Cited

U.S. PATENT DOCUMENTS

| | | | |
|---|---|---|---|
| 4,924,112 A | 5/1990 | Anderson et al. |
| 5,119,159 A | 6/1992 | Hoshi |
| 5,242,841 A | 9/1993 | Smayling et al. |
| 6,031,279 A | 2/2000 | Lenz |
| 6,130,458 A | 10/2000 | Takagi et al. |
| 6,420,780 B1 | 7/2002 | Ko |
| 6,700,793 B2 | 3/2004 | Takagawa et al. |
| 6,710,439 B2 | 3/2004 | Lee et al. |

(Continued)

FOREIGN PATENT DOCUMENTS

| KR | 20050085461 | 8/2005 |
|---|---|---|
| WO | 2004054078 | 6/2004 |

OTHER PUBLICATIONS

European Patent Office, "Office Action", "from Foreign Counterpart of U.S. Appl. No. 12/470,229", Feb. 12, 2013, pp. 1-5, Published in: EP.

(Continued)

*Primary Examiner* — Zandra Smith
*Assistant Examiner* — Tsz Chiu
(74) *Attorney, Agent, or Firm* — Fogg & Powers LLC

(57) ABSTRACT

A power converter can include an output circuit having a high-side device and a low-side device which can be formed on a single die (a "PowerDie"). The power converter can further include a controller integrated circuit (IC) formed on a different die which can be electrically coupled to, and co-packaged with, the PowerDie. The PowerDie can be attached to a die pad of a leadframe, and the controller IC die can be attached to an active surface of the first die such that the first die is interposed between the controller IC die and the die pad.

10 Claims, 9 Drawing Sheets

(56) References Cited

U.S. PATENT DOCUMENTS

| | | | |
|---|---|---|---|
| 6,812,782 B2 | 11/2004 | Grant | |
| 6,870,352 B2 | 3/2005 | Walters et al. | |
| 6,933,593 B2* | 8/2005 | Fissore et al. | 257/675 |
| 6,975,494 B2 | 12/2005 | Tang et al. | |
| 7,042,730 B2* | 5/2006 | Vaysse et al. | 361/719 |
| 7,271,470 B1 | 9/2007 | Otremba | |
| 7,436,070 B2* | 10/2008 | Uno et al. | 257/777 |
| 7,459,750 B2 | 12/2008 | Ludikhuize | |
| 7,618,896 B2 | 11/2009 | Joshi et al. | |
| 7,732,929 B2* | 6/2010 | Otremba et al. | 257/777 |
| 7,757,392 B2 | 7/2010 | Otremba | |
| 7,800,208 B2* | 9/2010 | Otremba | 257/678 |
| 8,089,147 B2 | 1/2012 | Pavier et al. | |
| 2002/0093094 A1* | 7/2002 | Takagawa et al. | 257/723 |
| 2003/0098468 A1 | 5/2003 | Wheeler et al. | |
| 2004/0125573 A1* | 7/2004 | Joshi et al. | 361/723 |
| 2004/0262678 A1 | 12/2004 | Nakazawa et al. | |
| 2005/0179472 A1 | 8/2005 | Nakamura et al. | |
| 2005/0245020 A1 | 11/2005 | Zhu et al. | |
| 2005/0280163 A1 | 12/2005 | Schaffer et al. | |
| 2006/0231904 A1 | 10/2006 | Kocon | |
| 2007/0034942 A1 | 2/2007 | Xu et al. | |
| 2007/0158778 A1 | 7/2007 | Kitabatake et al. | |
| 2007/0195563 A1 | 8/2007 | Shiraishi et al. | |
| 2007/0249092 A1 | 10/2007 | Joshi et al. | |
| 2008/0017907 A1* | 1/2008 | Otremba | 257/306 |
| 2008/0023785 A1 | 1/2008 | Hebert | |
| 2008/0023825 A1 | 1/2008 | Hebert et al. | |
| 2008/0024102 A1 | 1/2008 | Hebert et al. | |
| 2008/0203550 A1* | 8/2008 | Ewe et al. | 257/675 |
| 2008/0246086 A1 | 10/2008 | Korec et al. | |
| 2008/0268577 A1* | 10/2008 | Kagii et al. | 438/124 |
| 2009/0039394 A1 | 2/2009 | Uno et al. | |
| 2009/0057869 A1* | 3/2009 | Hebert et al. | 257/691 |
| 2009/0072368 A1 | 3/2009 | Hu et al. | |
| 2009/0130799 A1* | 5/2009 | Havanur | 438/109 |
| 2009/0263947 A1 | 10/2009 | Hebert | |
| 2009/0283919 A1* | 11/2009 | Tsui et al. | 257/778 |
| 2010/0133644 A1 | 6/2010 | Hebert | |
| 2010/0140693 A1 | 6/2010 | Hebert | |
| 2010/0155836 A1 | 6/2010 | Hebert | |
| 2010/0155837 A1 | 6/2010 | Hebert | |
| 2010/0155915 A1 | 6/2010 | Bell et al. | |
| 2011/0024884 A1* | 2/2011 | Xue et al. | 257/676 |

OTHER PUBLICATIONS

Chinese Patent Office, "Office Action", "from Foreign Counterpart of U.S. Appl. No. 12/471,911", Jan. 28, 2013, pp. 1-7, Published in: CN.

European Patent Office, "Office Action", "from Foreign Counterpart of U.S. Appl. No. 12/471,911", Feb. 12, 2013, pp. 1-5, Published in: EP.

Korean Intellectual Property Office, "Notice of Allowance", "from Foreign Counterpart of U.S. Appl. No. 12/471,911", Jan. 29, 2013, pp. 1-3.

U.S. Patent and Trademark Office, "Notice of Allowance", "U.S. Appl. No. 12/424,686", Jan. 17, 2012, pp. 1-12.

U.S. Patent and Trademark Office, "Office Action", "U.S. Appl. No. 12/424,686", Sep. 21, 2012, pp. 1-11.

Chinese Patent Office, "First Office Action", "from Foreign Counterpart of U.S. Appl. No. 12/470,229", Aug. 3, 2012, pp. 1-15, Published in: CN.

European Patent Office, "Partial European Search Report", "from Foreign Counterpart of U.S. Appl. No. 12/470,229", Feb. 22, 2012, pp. 1-6, Published in: EP.

European Patent Office, "Extended European Search Report", "from Foreign Counterpart of U.S. Appl. No. 12/470,229", Jun. 1, 2012, pp. 1-12, Published in: EP.

Korean Intellectual Property Office, "Notice of Allowance", "from Foreign Counterpart of U.S. Appl. No. 12/470,229", Nov. 30, 2011, pp. 1-3.

U.S. Patent and Trademark Office, "Final Office Action", "U.S. Appl. No. 12/470,229", Mar. 3, 2011, pp. 1-15.

U.S. Patent and Trademark Office, "Notice of Allowance", "U.S. Appl. No. 12/470,229", Dec. 28, 2011, pp. 1-12.

U.S. Patent and Trademark Office, "Office Action", "U.S. Appl. No. 12/470,229", May 14, 2010, pp. 1-7.

U.S. Patent and Trademark Office, "Office Action", "U.S. Appl. No. 12/470,229", Oct. 6, 2010, pp. 1-9.

U.S. Patent and Trademark Office, "Office Action", "U.S. Appl. No. 12/470,229", Sep. 7, 2011, pp. 1-12.

U.S. Patent and Trademark Office, "Restriction Requirement", "U.S. Appl. No. 12/470,229", Apr. 19, 2010, pp. 1-6.

Chinese Patent Office, "First Office Action", "from Foreign Counterpart of U.S. Appl. No. 12/471,911", Aug. 2, 2012, pp. 1-12, Published in: CN.

European Patent Office, "Extended European Search Report", "from Foreign Counterpart of U.S. Appl. No. 12/471,911", Jun. 1, 2012, pp. 1-14, Published in: EP.

European Patent Office, "Partial European Search Report", "from Foreign Counterpart of U.S. Appl. No. 12/471,911", Feb. 21, 2012, pp. 1-7, Published in: EP.

Korean Intellectual Property Office, "Notice of Allowance", "from Foreign Counterpart of U.S. Appl. No. 12/471,911", May 15, 2012, pp. 1-3.

Korean Patent Office, "Office Action", "from Foreign Counterpart of U.S. Appl. No. 12/471,911", Jan. 2, 2012, pp. 1-7, Published in: KR.

Korean Patent Office, "Office Action", "from Foreign Counterpart of U.S. Appl. No. 12/471,911", May 14, 2012, pp. 1-8, Published in: KR.

Korean Patent Office, "Office Action", "from Foreign Counterpart of U.S. Appl. No. 12/471,911", Jun. 18, 2012, pp. 1-7, Published in: KR.

U.S. Patent and Trademark Office, "Notice of Allowance", "U.S. Appl. No. 12/471,911", Aug. 5, 2011, pp. 1-7.

U.S. Patent and Trademark Office, "Notice of Allowance", "U.S. Appl. No. 12/471,911", Jan. 3, 2012, pp. 1-12.

U.S. Patent and Trademark Office, "Office Action", "U.S. Appl. No. 12/471,911", Apr. 15, 2011, pp. 1-19.

Chinese Patent Office, "Office Action", "from Foreign Counterpart of U.S. Appl. No. 12/477,818", Dec. 7, 2011, Published in: CN.

Chinese Patent Office, "Office Action", "from Foreign Counterpart of U.S. Appl. No. 12/477,818", Oct. 17, 2012, pp. 1-16, Published in: CN.

U.S. Patent and Trademark Office, "Notice of Allowance", "U.S. Appl. No. 12/477,818", Oct. 29, 2010, pp. 1-13.

U.S. Patent and Trademark Office, "Notice of Allowance", "U.S. Appl. No. 12/477,818", Feb. 22, 2011, pp. 1-13.

U.S. Patent and Trademark Office, "Restriction Requirement", "U.S. Appl. No. 12/477,818 ", Jul. 6, 2010, pp. 1-7.

* cited by examiner

STACKED POWER CONVERTER STRUCTURE AND METHOD

CROSS-REFERENCE TO RELATED APPLICATION

This application is a divisional application of U.S. application Ser. No. 12/477,818 filed Jun. 3, 2009, which claims priority to provisional U.S. Patent Application Ser. No. 61/140,610 filed Dec. 23, 2008, and to provisional U.S. Patent Application Ser. No. 61/162,232 filed Mar. 20, 2009, the disclosures of which are herein incorporated by reference in their entirety, and is also related to U.S. patent application Ser. No. 12/424,686 filed Apr. 16, 2009.

FIELD OF THE INVENTION

This invention relates to the field of semiconductor devices, and more particularly to power conversion and control structures and their methods of formation.

BACKGROUND OF THE INVENTION

Semiconductor devices which provide power converter functionality, for example for altering DC power using a DC to DC (DC-DC) converter, are used in various capacities. For example, input DC power from one or more batteries can be converted to provide one or more power outputs at voltages which can be higher or lower than the input DC voltage. Performing a power conversion function using integrated circuits (IC's) typically requires a DC high-side transistor electrically coupled with voltage in ($V_{IN}$), a DC low-side transistor electrically coupled with ground, and a control circuit. In a synchronous step-down device (i.e. a "synch buck" converter), for example, power conversion is performed to decrease voltage by alternately enabling the high-side device and the low-side device, with a switching and control function being performed by the controller circuit with high efficiency and low power loss through the device.

Power converter circuits which can operate at a high power density (for example, high voltage and high current) are needed, particularly devices which can efficiently convert high density power at a reasonable cost. One challenge with high power density is that the size of the output circuitry increases as the voltage and current rating of the converter increases. Different implementations of the controller circuit, the high-side device, and the low-side device have been used, each with its own advantages and disadvantages.

As depicted in FIG. 1, co-packaged devices 10 can include control circuitry on one semiconductor die 12 to provide a controller IC, the high-side device on a second die 14, and the low-side device on a third die 16. A circuit schematic of the FIG. 1 device is depicted in FIG. 2, which also depicts controller circuitry 12, high-side MOSFET 14 electrically coupled with $V_{IN}$, and low-side MOSFET 16 electrically coupled with device power ground ($P_{GND}$). The devices can have standard package pinouts and pin assignments such as those depicted. Forming controller, low-side, and high-side devices on separate dies can have problems with interconnection parasitics on the controller IC which can negatively influence device performance. This may result from parasitic inductance inherent in bond wires, electromagnetic interference (EMI), ringing, efficiency loss, etc. Higher-quality connections such as copper plate (or clip) bonding, or ribbon bonding, can be used to reduce parasitics, but this increases assembly costs. Further, co-packaging standard vertical MOSFETs can result in a circuit with parasitic inductance in series with the output node. Problems caused by parasitic inductances are well established in the art. While a capacitor can be connected to the output terminals such as the input ($V_{IN}$) and ground, to compensate for the negative impact of inductances connected to these nodes, capacitances cannot be connected to internal nodes such as the Ouput ($V_{OUT}$, also referred to as phase node or switched node).

Additionally, packages containing three separate dies have higher production costs, for example because of the large number of die attach steps (three dies in this example), and additional space is required for spacing between adjacent dies to allow for die attach fillets, die placement tolerance, and die rotation tolerance, which reduces the power-density which can be achieved. To reduce electrical interference between adjacent dies, each die is placed on a separate die pad.

Examples of co-packaged devices include non-synch buck with co-packaged high-side MOSFET and external Schottky diode, non-synch buck with co-packaged high-side and low-side MOSFETs, synchronous buck with co-packaged high-side and low-side MOSFETs, boost converter with co-packaged MOSFET, and boost converter with co-packaged MOSFET and Schottky diodes.

Discrete devices can also be mounted separately to a printed circuit board. In this solution, a first packaged die containing controller circuitry is used in conjunction with a second packaged die containing a high-side MOSFET and a third package containing a low-side MOSFET. The three packages are mounted on a printed circuit board. However, this can increase packaging costs as the number of dies and separate packages which must be manufactured and handled is at least tripled, and the area used on the printed circuit board is also increased, leading to increased circuit board size.

There is a need for power converters in which device processing costs and device footprint are reduced while providing a power converter device which has sufficient device electrical characteristics with low parasitic inductance and capacitance.

BRIEF DESCRIPTION OF THE DRAWINGS

The accompanying drawings, which are incorporated in and constitute a part of this specification, illustrate embodiments of the invention and together with the description, serve to explain the principles of the invention. In the figures.

It should be noted that some details of the FIGS. have been simplified and are drawn to facilitate understanding of the inventive embodiments rather than to maintain strict structural accuracy, detail, and scale.

DESCRIPTION OF THE EMBODIMENTS

Reference will now be made in detail to the present embodiments (exemplary embodiments) of the invention, examples of which are illustrated in the accompanying drawings. Wherever possible, the same reference numbers will be used throughout the drawings to refer to the same or like parts.

Figure 1:
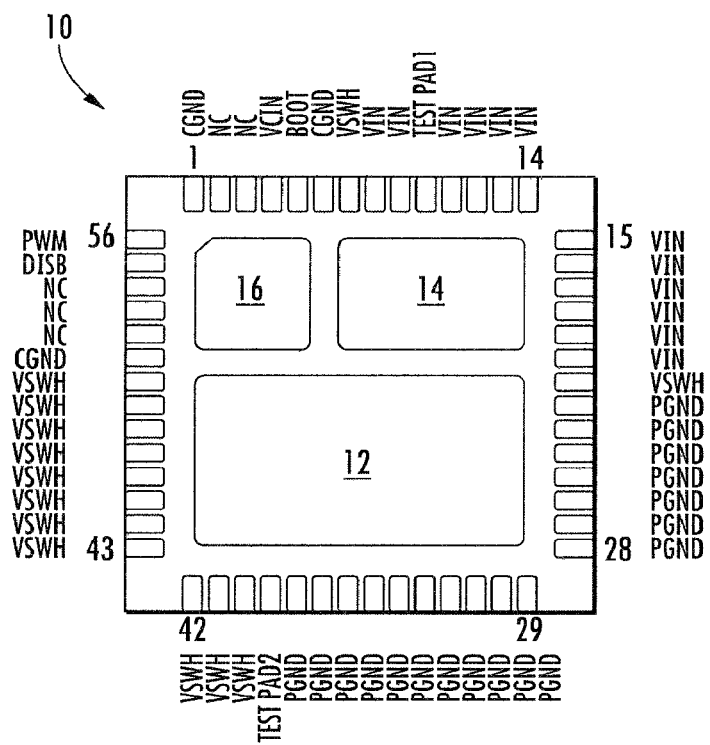
FIG. 1 is a bottom view of a conventional power converter device.
Figure 2:
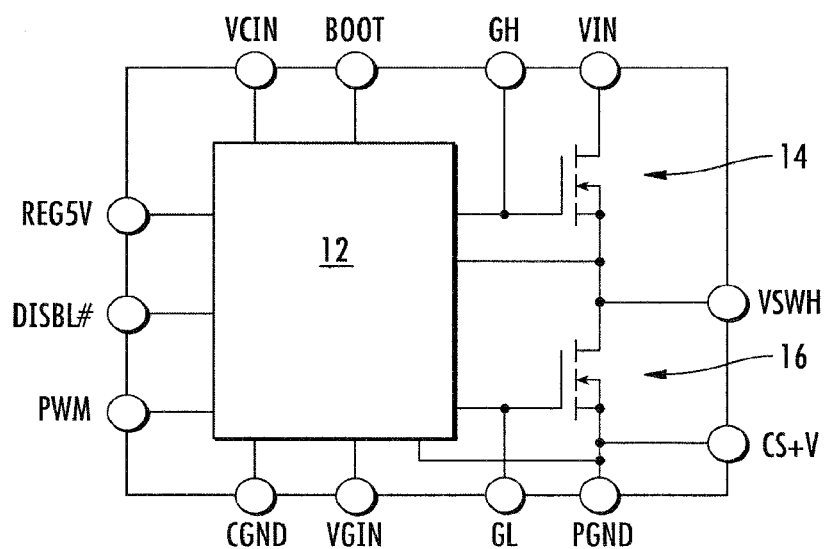
FIG. 2 is a schematic of a voltage converter device including output power devices.

An embodiment of a conventional power conversion device such as DC-DC converter can typically include three dies co-packaged in a single device having input/output leads arranged in a standard configuration such as that depicted in FIG. 1, previously described.

A device design incorporating both high-side power output transistor (high-side device) and low-side power output transistor (low-side device) on a single die (referred to as a "PowerDie") is disclosed in co-pending U.S. patent application Ser. No. 12/470,229, filed May 21, 2009 and titled "Co-Packaging Approach for Power Converters Based on Planar Devices, Structure and Method." This application, commonly assigned with the present application and incorporated herein by reference in its entirety, describes the use of a PowerDie along with a controller IC having controller circuitry on a separate die which can be packaged separately and placed on a supporting substrate such as a printed circuit board (PCB), or which can be co-packaged as two separate dies into a single semiconductor device, such as an encapsulated semiconductor device.

Figure 3:
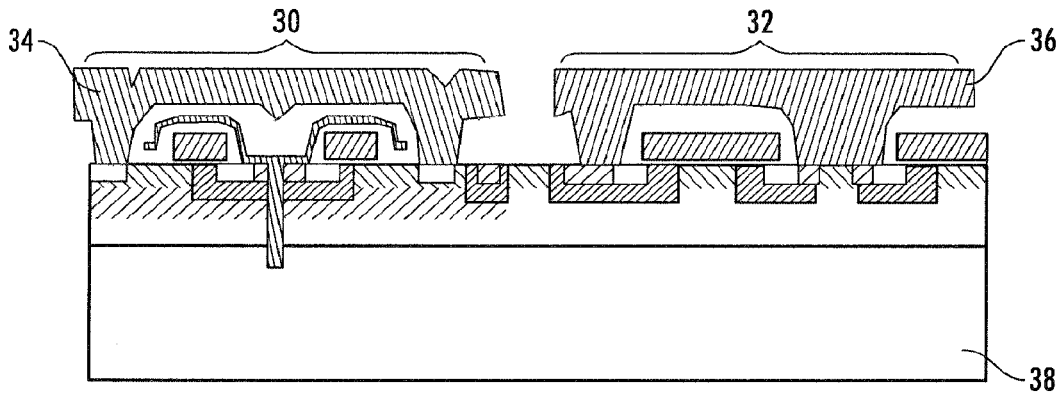
FIG. 3 is a partial cross section of a semiconductor die which can be used with an embodiment of the invention.

FIG. 3 depicts an exemplary die from the referenced application that can be used with the present device. The structure of FIG. 3 can include a voltage converter power output device having a high-side power device MOSFET 30 and a low-side power device MOSFET 32 formed on a single semiconductor die. A conductive layer, which can be metal, has a first portion 34 that connects to drain regions of the high-side MOSFET, and is also electrically coupled with voltage in ($V_{IN}$). A second portion 36 of the conductive layer connects to source regions of the low-side MOSFET, and is also electrically coupled with ground. The device can further be configured such that the semiconductor substrate 38 will provide its output to an inductor of the power converter through the back side of the PowerDie. The PowerDie can thus provide a device switched node through the back side. FIG. 3 (and FIG. 7, described below) depicts power devices with "striped" gate fingers, which are parallel. Variations of the geometries are possible, such as "closed cell" geometries which are well known by those of ordinary skill in the art of power devices. A closed cell geometry refers to structures with gate fingers which surround the source and body contact. The cells can be square, rectangular, hexagonal, etc.

Another device incorporating a high-side MOSFET and a low-side MOSFET on a single die is described in U.S. patent application Ser. No. 12/471,911, filed May 26, 2009 and titled "Single Die Output Power Stage Using Trench-Gate Low-Side and LDMOS High-Side MOSFETs, Structure and Method," which is commonly assigned with the present application and incorporated herein by reference in its entirety. The device described in detail in this application can also be used with the present invention.

An embodiment of the present invention can comprise various configurations other than those described in the referenced documents. Performing a power conversion function can include the use of a first semiconductor die comprising one or more DC high-side switches electrically coupled with (and providing a switch to) voltage in ($V_{IN}$) and one or more DC low-side switches electrically coupled with (and providing a switch to) ground. The device can also comprise a second semiconductor die comprising a control circuit which can be used to control the gating (on and off switching) of the high-side and low-side switches at appropriate times. The high-side and low-side switches (i.e. the power devices) can include one or more transistors of various types such as field-effect transistors (FETs) or bipolar transistors. As used herein, a "transistor" is an electronic device comprising a gate, a source, and a drain, (MOSFET transistor) or a base, an emitter, and a collector (bipolar transistor) wherein the flow of current through the transistor can be turned on and off at selected times by the application of a threshold voltage to the transistor device. Also as used herein, a "controller IC" is a semiconductor die comprising control circuitry which can be used to control the gating (on and off switching) of the high-side and low-side switches at appropriate times. While the use of transistors provides one embodiment of the invention, the power devices can comprise or include micro-electromechanical switches (MEMS), if MEMS devices with a sufficiently low resistance and high speed are used. Other switching devices can also be used, depending on the application.

Various embodiments of the invention can also have various input/output pin configurations. While various embodiments of the invention are not limited by specific pin configurations unless specified as such, in one exemplary embodiment the pin assignment configuration of the FIG. 4 device 40 can be used. It should be noted that, to facilitate the description of the present invention, FIGS. 4-6 and 8-10 are plan views of the top of the device, while FIG. 1 is a plan view of the bottom of a device.

Figure 4:
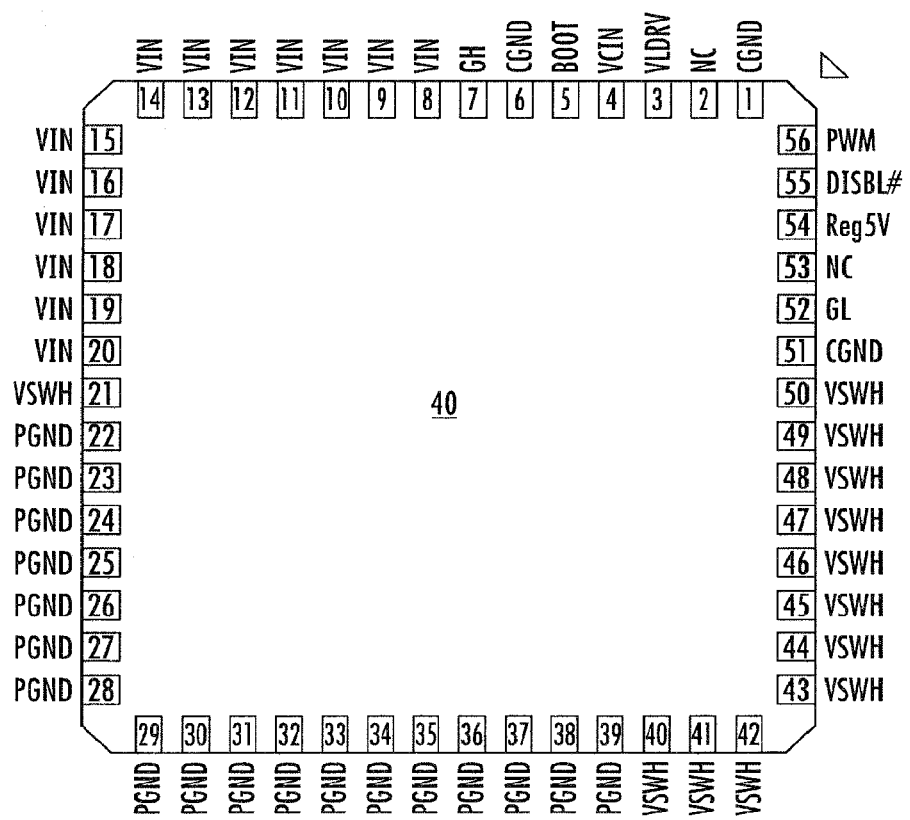
FIG. 4 is a top plan view of an embodiment of the invention.
Figure 5:
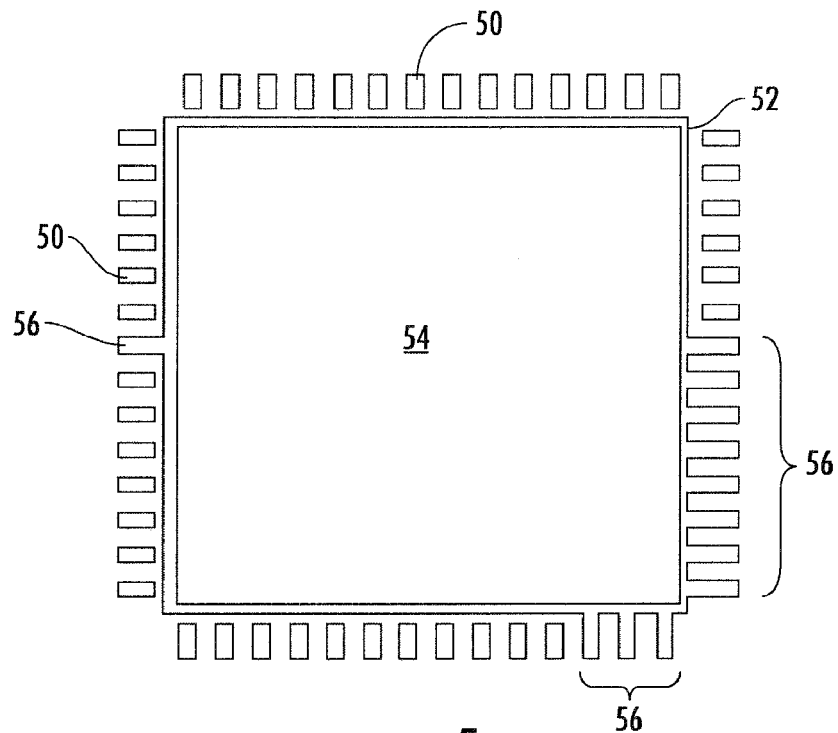
FIGS. 5, 6, and 8-10 are top plan views.

A first embodiment of the invention to provide a voltage converter such as a step-down ("synch-buck") device is depicted in FIGS. 5-10. A synch-buck converter achieves high performance using NMOS high-side and NMOS low-side devices, whereas a boost converter could use a low-side NMOS with a Schottky diode connected in series with the output load. A non-synchronous buck could use a high-side NMOS or PMOS, with a Schottky diode or diodes as the low-side device instead of a FET. FIG. 5 depicts a leadframe such as a quad flat no-lead (QFN) leadframe including a plurality of leads 50 and a die pad 52. A first semiconductor die 54, which can be a monolithic die including both high-side and low-side power output devices similar to the FIG. 3 device, and the semiconductor substrate supplying the switched node $V_{SWH}$, is attached to the die pad with, for example, a conductive epoxy or other conductive die attach techniques. Conforming devices are described in the two co-pending applications referenced above. In this embodiment, leads 56 are directly connected to the leadframe die pad to provide "fused leads" which are formed integrally from a continuous metal portion which includes the die pad. Referring to FIG. 4, these leads 56 are $V_{SWH}$ pinouts for the device, and will be electrically coupled to the PowerDie $V_{SWH}$ through the back side of the PowerDie. Other leadframe structures are not depicted in this simplified view, such as tie bars to attach the die pad to the leadframe, leadframe rails, and additional die pads for other devices assembled at the same time as part of the leadframe strip.

Figure 6:
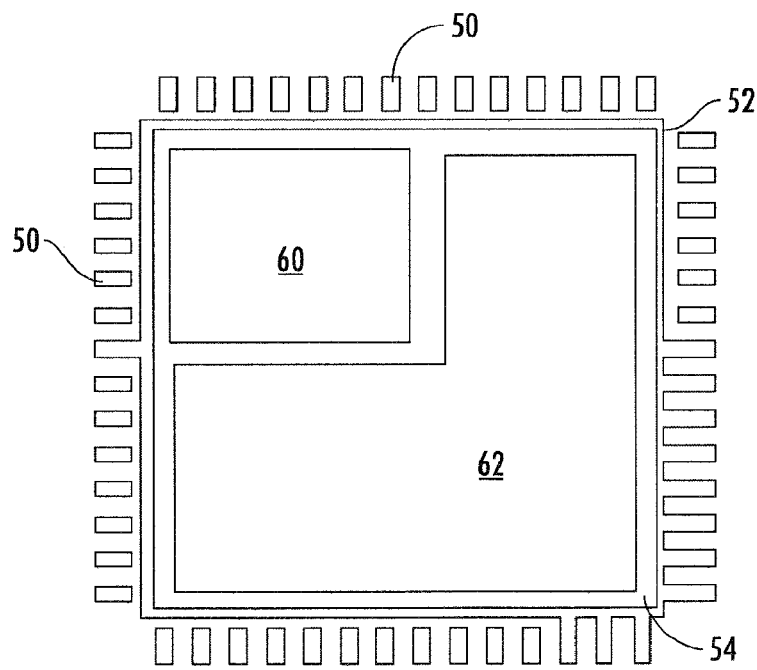
Figure 7:
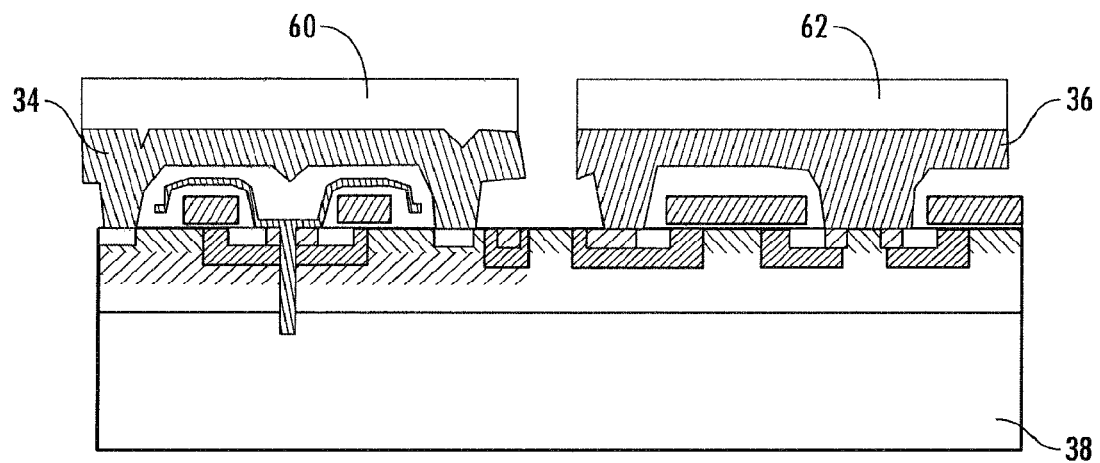
FIG. 7 is a partial cross section, of a first method for practicing an embodiment of the invention.

After forming a structure similar to FIG. 5, a metallization layer including first 60 and second 62 portions is formed over the first semiconductor die. This metallization, which provides an intermediate conductive plane, can also be formed prior to assembly of the die 54 on the die pad 52, for example during manufacture of the die. As depicted in FIG. 6, metallization 60 is formed to contact portion 34 of the conductive layer which connects to drain regions of the high-side MOSFET. Conductor 34 is electrically coupled with voltage in ($V_{IN}$), and thus couples metal 60 with $V_{IN}$. Metallization 62 is formed to contact portion 36 of the conductive layer which connects to source regions of the low-side MOSFET. Conductor 36 is electrically coupled with power ground ($P_{GND}$) and thus couples metal 62 with ground. While metal 60, 62 as depicted in FIG. 7 is formed as a blanket layer to contact underlying layers 34, 36 respectively, a scheme using one or more conductive contacts through a dielectric layer to underlying layers 34, 36 is also contemplated.

Figure 8:
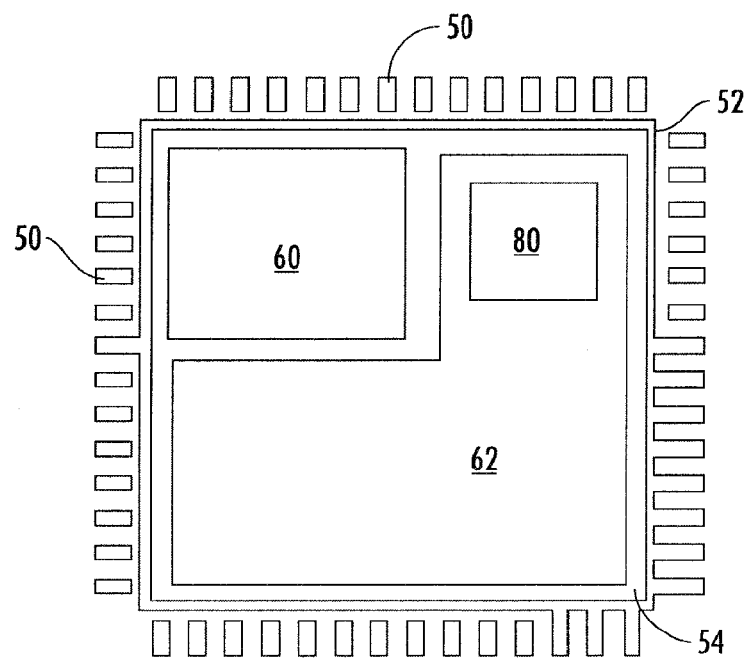

After forming a structure similar to that depicted in FIG. 6, the back side of a controller IC die 80 having controller circuitry is attached to metallization 62 as depicted in FIG. 8. If a conductive die attach adhesive is used, the back side of the controller IC (the semiconductor substrate, if exposed) can be electrically coupled with device ground ($P_{GND}$) through metal 62 and conductor 36 to provide the connections necessary to ensure proper control and operation of the controller IC chip 80.

Figure 9:
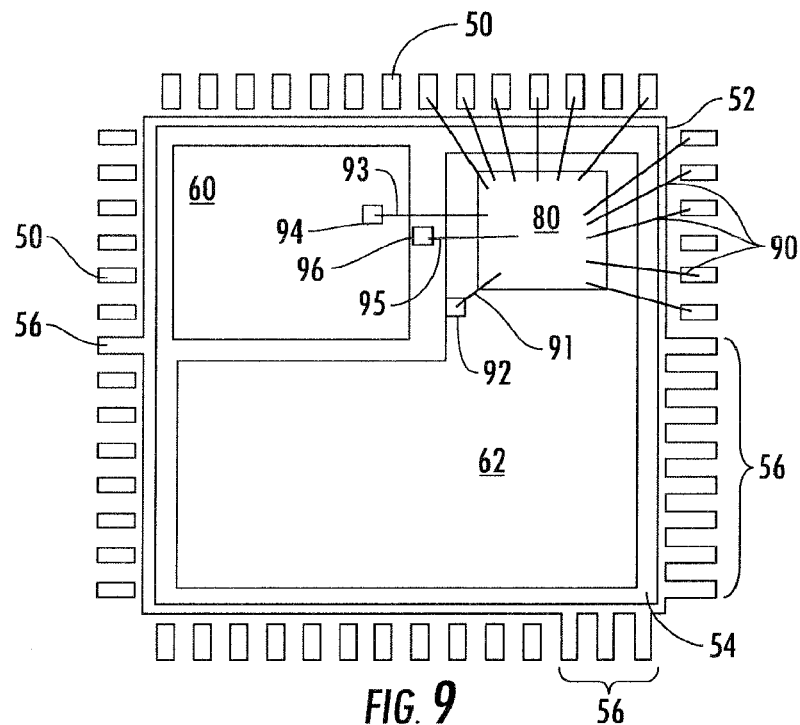

Subsequently, bond wires 90 can be used to electrically connect (electrically couple) bond pads (not individually depicted) on the controller IC 80 to various locations, such as to the leads 50 of the leadframe as depicted in FIG. 9. A bond wire 91 can connect a bond pad on the controller IC 80 to a pad area 92, which is connected to the gate electrode of the low-side device using a contact. Another bond wire 93 can connect a bond pad on the controller IC 80 to a pad area 94, which is connected to the gate electrode of the high-side device using a contact. Another bond wire 95 can connect a bond pad on the controller IC to a pad area 96, which can be coupled to the substrate of the PowerDie using a contact to provide an electrical connection to the switched node $V_{SWH}$.

Figure 10:
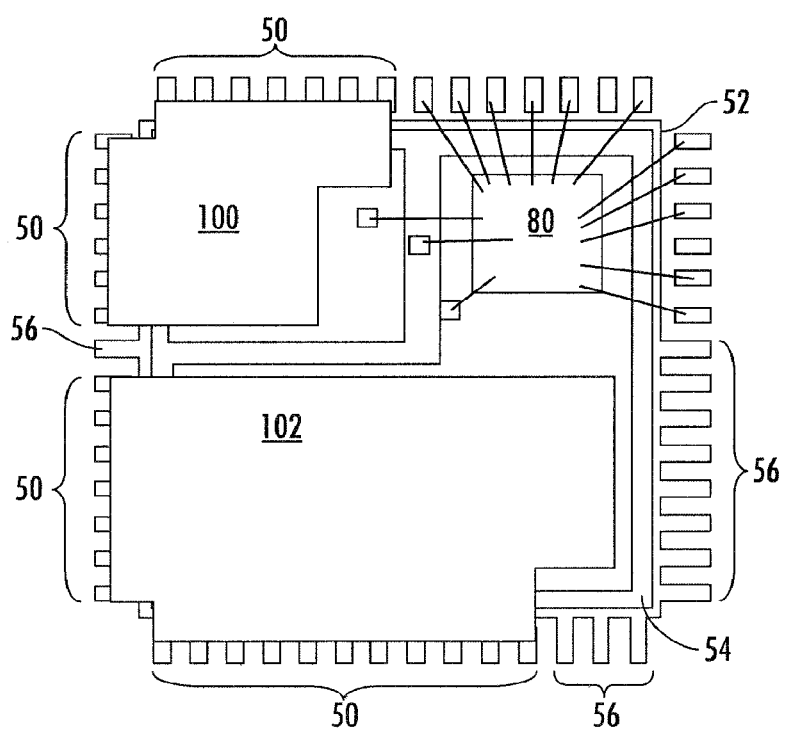

Signals $_{VIN}$ and $_{PGND}$ can then be attached to the appropriate leadframe leads, for example using the clips (straps) as depicted in FIG. 10. A first conductive clip 100, for example formed from copper, can be formed to electrically couple metal 60 to a plurality of first leadframe leads, and clip 102 electrically can be formed to electrically couple metal 62 to a plurality of second leads. Because metal 60 is electrically coupled with the PowerDie $_{VIN}$ through layer 34, the appropriate $_{VIN}$ connections are made between the PowerDie $_{VIN}$ (and the controller IC through bond wire connections 90) the leadframe leads through clip 100. Further, because metal 62 is electrically coupled with the PowerDie $_{PGND}$ through layer 36, the appropriate $_{PGND}$ connections are made between the PowerDie $_{PGND}$ (and the controller IC through bond wire connections 90) and the leadframe leads through clip 102. FIG. 10 depicting $_{VIN}$ clip 100 and $_{PGND}$ clip 102 can be compared with the signal pinouts of FIG. 4. In an embodiment, a contact area between each clip 100, 102 and metal 60, 62 respectively over the active area of the transistors can be maximized.

Various other processing of the FIG. 10 device, such as the formation of passivation, encapsulation, separation from the leadframe strip, etc. can be performed to provide a completed device such as a driver MOS (DrMOS) device. It should be noted that various processing steps can be performed in an order other than that described, which details one exemplary embodiment for providing the completed semiconductor device.

Thus a device formed in accordance with an embodiment as described can result in a device in which the output power devices (high-side and low-side) and the controller IC are packaged into a single semiconductor package. Because the perimeter of the controller IC die is completely within the perimeter of the output die, a package with a smaller footprint compared to conventional devices can be provided. Further, the device can include a single die pad while providing functionality for a high-side output power device, a low-side output power device, and a controller IC. The described device includes fewer dies than comparable conventional devices and provides no loss of functionality and equivalent power levels. Further, parasitic inductance between the source of the high-side device and the output node (switched node, $V_{SWH}$) is eliminated. The device structure is compatible with clip (strap) copper bonding technology, which can reduce assembly costs, resistance, and parasitic capacitance.

Figure 11:
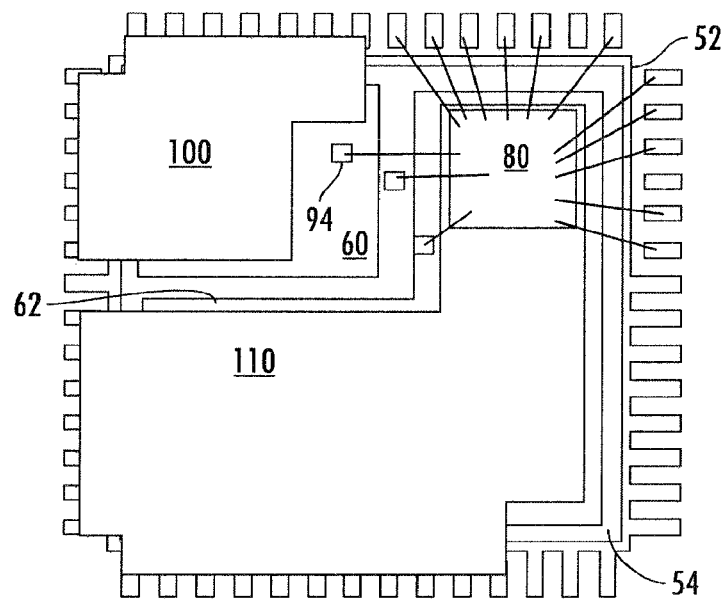
FIGS. 11-15 are plan views of other embodiments of the invention.

Another embodiment is depicted in FIG. 11. In this embodiment, strap 110 covers a larger area of metal layer 36 than strap 102 of FIG. 10, and more particularly covers the area under controller IC 80. Thus straps 100, 110 can be attached to the surface of metal layers 34, 36 respectively prior to attaching controller IC 80, and prior to wire bonding. This embodiment can provide additional shielding between the controller IC 80 and the PowerDie 40, which can reduce electrical interference between the PowerDie and the controller IC. Additionally, the pads 92, 94 can be plated with NiAu to reduce or eliminate oxidation during the various assembly processes performed prior to wire bonding.

Figure 12:
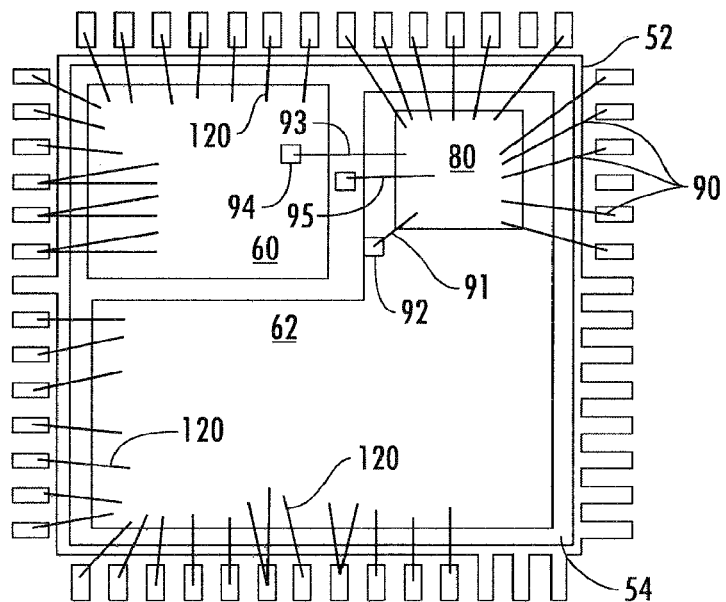

Another embodiment is depicted in FIG. 12. In this embodiment, leads of the leadframe are connected with bond wires 120 instead of the clips (straps) of the FIG. 10 embodiment, for example.

Figure 13:
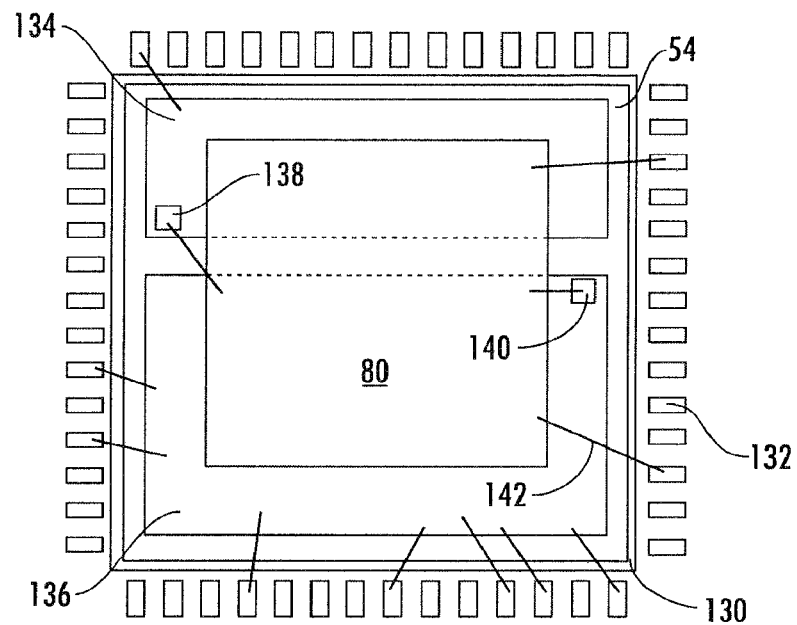

FIG. 13 depicts an embodiment including a leadframe die pad 130 and leadframe leads 132. In this embodiment, the leads 132 are not formed integrally with the die pad, although embodiments having this arrangement are also contemplated. FIG. 13 further depicts a first portion 134 of a conductive layer which is analogous to structure 60 of FIGS. 7 and 8, and similarly connects to drain regions of the high-side MOSFET, and is also electrically coupled with voltage in ($V_{IN}$). A second portion 136 of the conductive layer is analogous to structure 62 of FIGS. 7 and 8, and similarly connects to source regions of the low-side MOSFET, and is also electrically coupled with ground. The device can further be configured such that the semiconductor substrate will provide its output to an inductor of the power converter, such that the back of the PowerDie can provide a device switched node. Pad 138 provides electrical contact to the gate of the high-side device, and pad 140 provides electrical contact to the gate of the low-side device. FIG. 13 further depicts a controller IC die 80, first bond wires 142 which connect bond pads on the controller IC to leads 132 of the leadframe, and second bond wires 144 which connect the conductive layer portions 134, 136 to leads of the leadframe to supply $V_{IN}$ and $P_{GND}$ respectively.

As depicted, the controller IC directly overlies both the high-side power device and the low-side power device such that both conductive layer portions 134, 136 are directly interposed between the PowerDie 54 and the controller IC 80. The controller IC 80 thus bridges the gap between both conductive layer portions 134, 136. This can be necessary if the size of the controller IC compared to the size of the PowerDie requires placement of the controller IC over both the low-side and high-side devices of the PowerDie. As such, the die attach adhesive which connects the controller IC to conductive layer portions 134, 136 is nonconductive to prevent a power-to-ground short. In this embodiment, a connection to the gate of the high-side device can be provided to the controller IC through a pad area 138 having a contact to the high-side gate, and a connection to the gate of the low-side device can be provided to the controller IC through a pad area 140 having a contact to the low-side gate.

Figure 14:
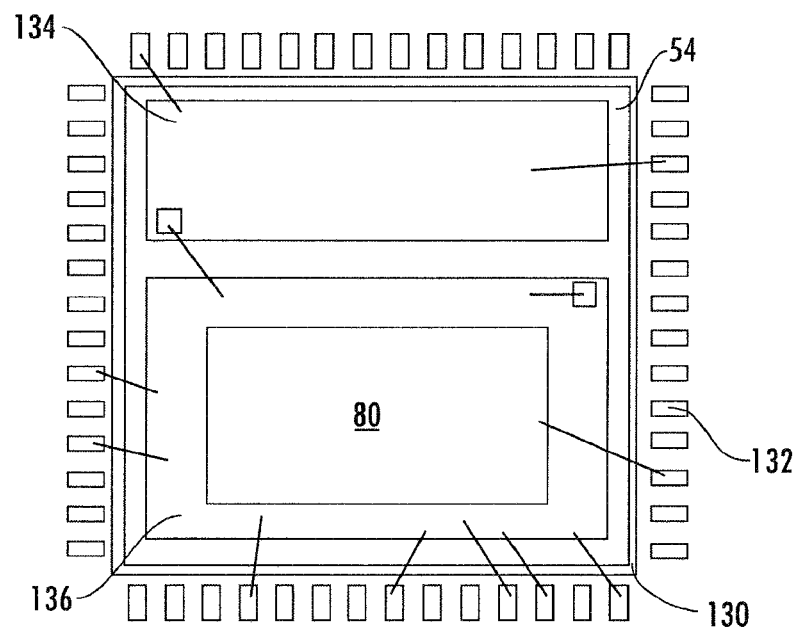

FIG. 14 depicts an embodiment in which the controller IC is sufficiently small to overlie only the low-side output power device, and does not bridge the gap between the conductive layer portions 134, 136. As such, the die attach adhesive which connects the controller IC to the metal 136 of the low-side device can be nonconductive or conductive. If conductive, the back side of the controller IC will be electrically coupled with $P_{GND}$.

Figure 15:
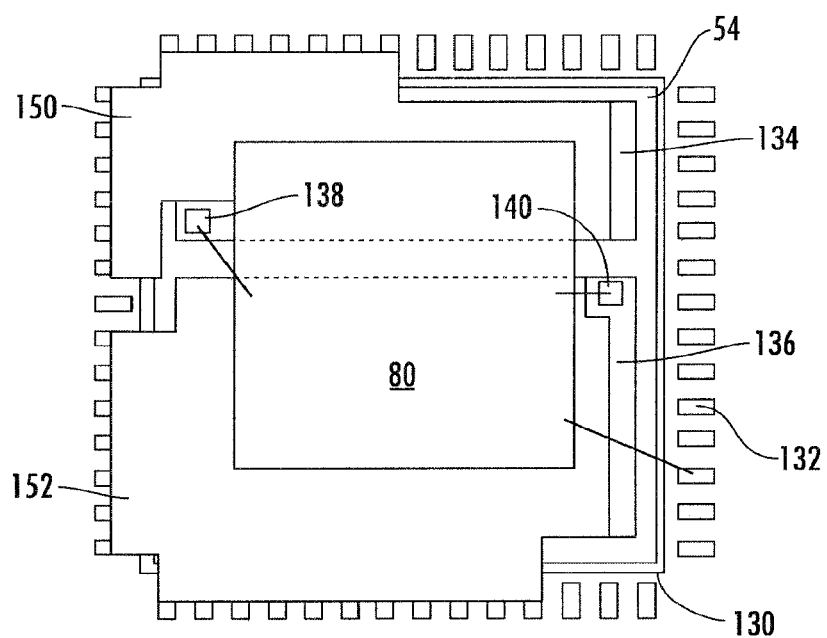

An embodiment as depicted in FIG. 15 is contemplated in which the controller IC 80 bridges the gap between conductor portions 134 and 136 as in FIG. 13, and clips 150 and 152 are used. Clip 150 electrically couples conductive layer portion 134 to the $V_{IN}$ leads, and clip 152 electrically couples conductive layer portion 136 to the $P_{GND}$ leads. Thus the $V_{IN}$ leads (pinouts 8-20 in FIG. 4) are electrically coupled to $V_{IN}$ (output device power in) through clip 150, conductive layer portion 134 (analogous to conductor 60 in FIG. 7), and conductive layer 34 (FIG. 7). The $P_{GND}$ leads (pinouts 22-39 in FIG. 4) are electrically coupled to $P_{GND}$ (output device ground) through clip 152, conductive layer portion 136 (analogous to conductor 62 in FIG. 7), and conductive layer 34 (FIG. 7). In this embodiment, the die attach adhesive which connects the controller IC to the conductor layer portions 134, 136 is nonconductive. However, a thermally conductive material would improve the conductivity of heat away from the PowerDie.

In various embodiments, die attach for the controller IC can be epoxy dispensed during the assembly of the package, or can be spread on the back of the controller IC die prior to dicing. For the package thickness to be less than about 1.0 mm, the controller IC and the PowerDie can be thinned to about 150 microns (6 mil) or less. The $V_{IN}$ and $P_{GND}$ connections to the controller IC can be made directly by "down bonding" from the controller IC to the metal on top of the high-side device and the metal on the low-side device. To minimize the wire bond loop heights, standard bonding techniques such as stitch on ball or reverse bonding, or others, can be used. To reduce the risk of oxidation during assembly, the pads can be plated with NiAu, for example using an electroless plating procedure. If a copper clip is used for various embodiments, it can be attached prior to placing the controller IC die.

The controller IC 80 can be placed on circuit nodes which are relatively quiet compared to other nodes. By separating the controller IC from the switched node ($V_{SWH}$), noise and other interference can be reduced to result in improved electrical performance over conventional devices.

Figure 16:
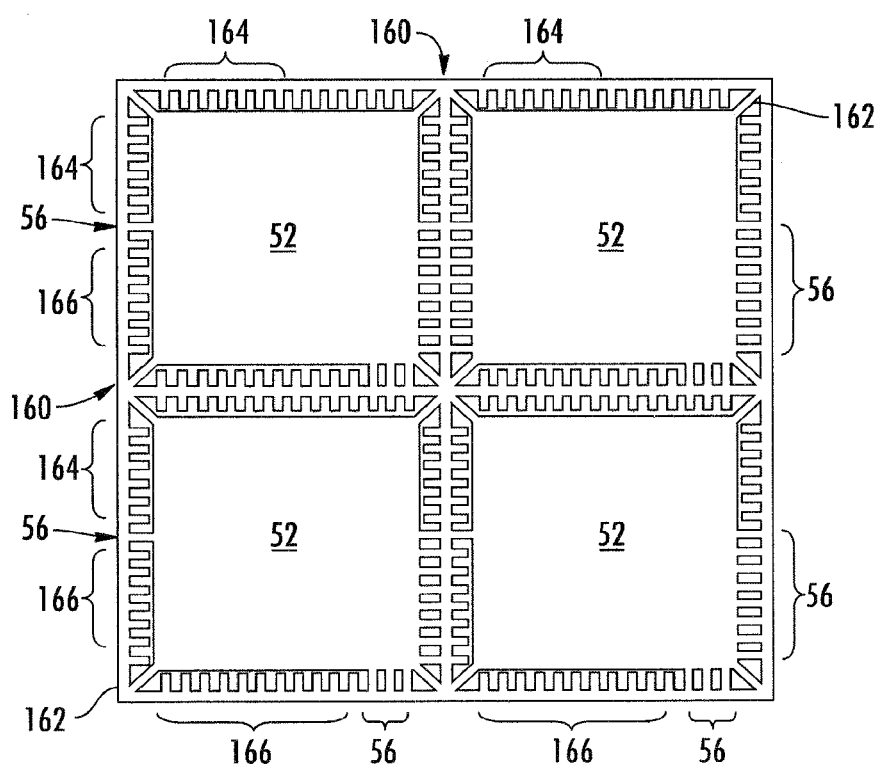
FIGS. 16-18 are plan views of leadframe and "clipframe" structures used in an embodiment of the invention.
Figure 17:
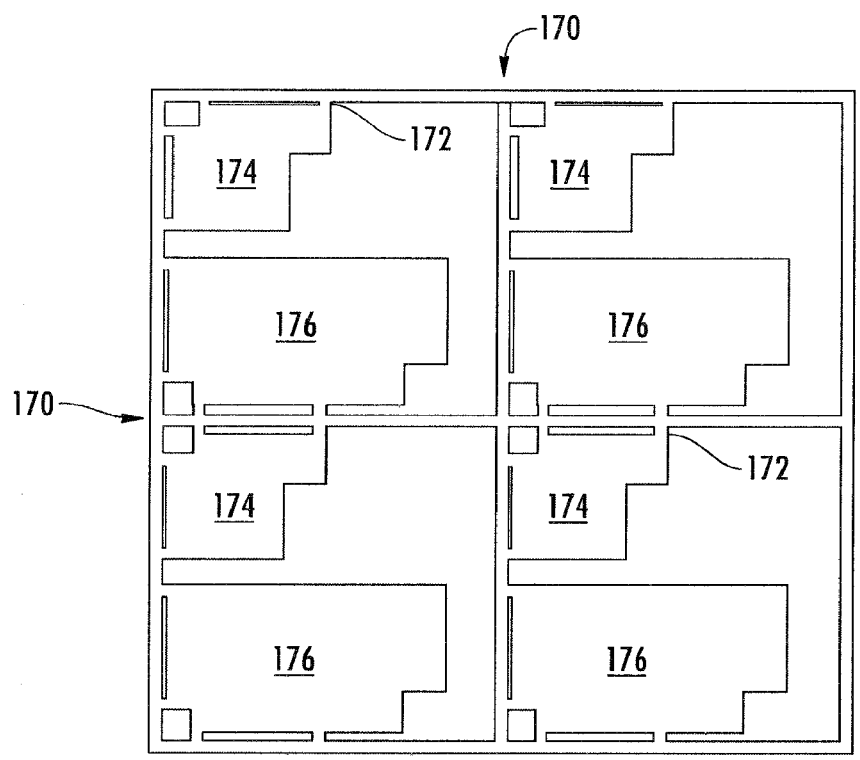
Figure 18:
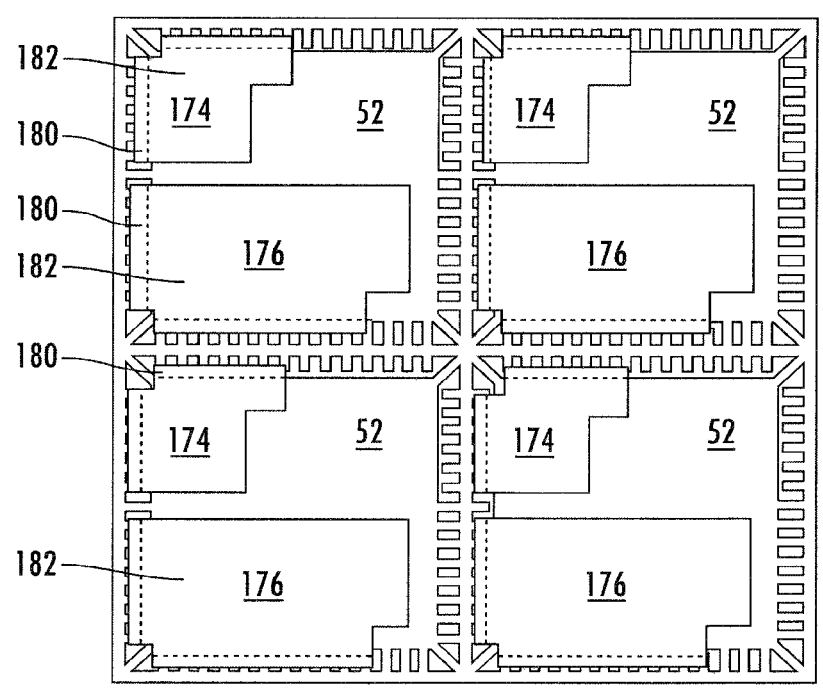

An embodiment of a system for forming matching leadframes and conductive clips for a particular device design using a frame system is depicted in FIGS. 16-18. In this embodiment, the leadframe and "clipframe" are designed for the die of FIG. 10. FIG. 16 depicts a leadframe structure including four die pads 52, leads 50, 56 similar to those depicted in FIG. 5, leadframe rails 160, and tie bars 162 which attach the die pads 52 to the leadframe rails 160. The clips are specifically designed to be attached to leads 164, 166 in FIG. 16 and to an active surface (circuit side) of a semiconductor die. Leads 56 are formed integral with the die pad 52 to supply $V_{SWH}$ from the back side of the PowerDie.

FIG. 17 depicts the clipframe structure which includes rails 170, tie bars 172, and clips 174 and 176, which can be different shapes as depicted. Clips 174 are analogous to clips 100 of FIG. 10, and will attach to leads 164 and to an active surface of a semiconductor die. Clips 176 are analogous to clips 102 of FIG. 10, and will attach to leads 166. Thus each pair of clips 174 and 176 are adapted for attachment to the active surface (i.e. for attachment to the circuit side) of a single semiconductor die. The tie bars 172 attach each individual clip to the clipframe rails 170.

FIG. 18 depicts alignment of the FIG. 17 structure to the FIG. 16 structure, which matches the FIG. 10 alignment of clips 100, 102 to leads 50 and die pad 52. During manufacture, a portion of each clip is bent so that a first portion 180 of each clip can contact the leads 56 of the leadframe, and a second portion 182 of each clip can be attached at a different level to the top of the PowerDie, or to the conductive layer formed over the PowerDie.

In use of the clipframe system, a die such as a PowerDie can be attached to each of the die pads 52 of FIG. 16 using a conductive adhesive such that each die pad is electrically coupled with $V_{SWH}$, provided on the back side of the die connected thereto. An overlying conductive layer is formed over each die (which can also be formed prior to die attach) with a first portion connected to the metal layer which supplies $V_{IN}$, and a second portion connected to the metal layer which supplies $P_{GND}$. The clips 174, 176 of FIG. 17 can then attached to the overlying conductive layer and to the leads of each using solder, conductive paste, etc. while attached to the clipframe rails 170. A controller IC can then be attached to one or more of the clips over each PowerDie. If a portion of a clip is not interposed between the controller IC and the PowerDie, the controller IC can be attached prior to clip attachments. Any wire bonding can be performed at an appropriate time during the assembly process. The devices attached to the leadframe of FIG. 16 and the clipframe of FIG. 17 can be encapsulated in mold compound, then each assembled device can be separated from the leadframe and clipframe, for example using a saw which separates the clips and leadframe leads from the rails 160, 170 to produce completed semiconductor devices. In another embodiment, the clips can be separated from the rails and placed over the PowerDie, for example using a pick and place apparatus.

Thus an embodiment of the invention can include various described elements. In one embodiment, a leadframe having a die pad is provided, and a first semiconductor die is attached to the die pad with a conductive die attach adhesive. The first die can include power converter high-side and low-side devices formed on and in the first semiconductor die. A back side of the first die, which can be a semiconductor substrate, can supply a switched node of the device to the die pad through the conductive adhesive. Leadframe leads formed integrally with the die pad and electrically coupled therewith can thereby be coupled with the switched node of the device to supply a $V_{SWH}$ signal. A conductive layer can be formed over the first semiconductor die, which can include a first portion overlying the high-side device and a second portion electrically isolated from the first portion formed over the low-side device. The first portion of the conductive layer can be electrically coupled to the drain of the high-side device, which is also electrically coupled with device voltage in ($V_{IN}$). The second portion of the conductive layer can be electrically coupled with the source of the low-side device, which is also electrically coupled with device ground ($P_{GND}$). A first clip can be electrically coupled with the first portion of the conductive layer and with one or more leadframe leads to electrically couple $V_{IN}$ with the leadframe leads to which it is attached. A second clip can be electrically coupled with the second portion of the conductive layer and with one or more leadframe leads to electrically couple $P_{GND}$ with the leadframe leads to which it is attached. A second semiconductor die including controller circuitry formed thereon and therein can be attached to the second portion of the conductive layer (which can supply $P_{GND}$) using either a conductive or nonconductive adhesive. Thus the first semiconductor die is interposed directly between the second semiconductor die and the die pad, and the second die is attached to an active surface of the first die. In another embodiment, the controller IC can be attached to both the first portion of the conductive layer and the second portion of the conductive layer using a nonconductive die attach adhesive. In yet another embodiment, the controller IC can be attached to either the first clip or the second clip using either a conductive or nonconductive die attach adhesive. The first semiconductor die (PowerDie) and the controller IC can be encapsulated in plastic resin or otherwise packaged to provide a power converter having two semiconductor dies and a single die pad. The device can have a reduced cost, simplified assembly processing, and improved electrical characteristics compared with conventional devices which include three or more dies in a single package, or the use of multiple encapsulated devices which provide similar functionality.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. −1, −2, −3, −10, −20, −30, etc.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "including." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The invention claimed is:

1. A power converter device, comprising:
    a first semiconductor die comprising a high-side power output switch and a low-side power output switch, wherein the first semiconductor die is attached to a leadframe die pad;
    a first conductive layer portion electrically coupled with a drain of the high-side power output switch and to device voltage in ($V_{IN}$);
    a second conductive layer portion electrically coupled with a source of the lowside power output switch and to device ground ($P_{GND}$);
    a second semiconductor die comprising controller circuitry thereon overlying the first semiconductor die such that the first semiconductor die is interposed between the second semiconductor die and the leadframe die pad.

2. The power converter device of claim 1 further comprising:
    a semiconductor substrate of the first semiconductor die supplying a switched node ($V_{SWH}$) of the high-side power output switch;
    a conductive die attach adhesive attaching the semiconductor substrate of the first semiconductor die to the die pad;
    at least one leadframe lead formed integrally with the die pad to receive $V_{SWH}$ from the high-side power output switch through the semiconductor substrate of the first die, the die attach adhesive, and the die pad.

3. The power converter device of claim 2, further comprising:
    a bond pad electrically connected to the substrate of the first semiconductor die; and
    a wire bond which electrically couples the second semiconductor die to the bond pad to supply $V_{SWH}$ to the second semiconductor die.

4. The power converter device of claim 1 further comprising:
    a first conductive clip attached to the first conductive layer portion and to at least one first lead of the leadframe, such that the at least one first lead of the leadframe is electrically coupled with $V_{IN}$; and
    a second conductive clip attached to the second conductive layer portion and to at least one second lead of the leadframe, such that the at least one second lead of the leadframe is electrically coupled with $P_{GND}$.

5. A semiconductor device comprising:
    a first semiconductor die comprising a high-side power output transistor and a low-side power output transistor, wherein the first semiconductor die is attached to a leadframe die pad,
    a first conductive layer portion electrically coupled with a drain of the high-side power output transistor and to device voltage in ($V_{IN}$);
    a second conductive layer portion electrically coupled with a source of the lowside power output transistor and to device ground ($P_{GND}$);
    a semiconductor substrate of the first semiconductor die supplying a switched node ($V_{SWH}$) of the high-side power output transistor;
    a conductive die attach adhesive attaching the semiconductor substrate of the first semiconductor die to the die pad;
    at least one leadframe lead formed integrally with the die pad to receive ($V_{SWH}$) from the high-side power output transistor through the semiconductor substrate of the first die, the die attach adhesive, and the die pad;
    a second semiconductor die comprising controller circuitry thereon overlying the first semiconductor die such that the first semiconductor die is interposed between the second semiconductor die and the leadframe die pad;
    a bond pad electrically coupled to the semiconductor substrate of the first die;
    a wire bond which electrically couples the second semiconductor die to the bond pad to supply $V_{SWH}$ to the second semiconductor die;

a first conductive clip attached to the first conductive layer portion and to at least one first lead of the leadframe, such that the at least one first lead of the leadframe is electrically coupled with $V_{IN}$; and a second conductive clip attached to the second conductive layer portion and to at least one second lead of the leadframe, such that the at least one second lead of the leadframe is electrically coupled with $P_{GND}$.

6. A power converter device, comprising:

a first monolithic semiconductor die comprising a high-side power output transistor and a low-side power output transistor;

a metal layer formed on the first monolithic semiconductor die; and a second semiconductor die comprising controller circuitry thereon overlying the first monolithic semiconductor die, wherein the metal layer has at least a portion directly interposed between the first monolithic semiconductor die and the second semiconductor die.

7. The power converter device of claim 6 wherein the metal layer is an intermediate conductive plane comprising:

a first metal layer portion electrically coupled with device voltage in ($V_{IN}$); and a second metal layer portion electrically coupled with device ground ($P_{GND}$).

8. The power converter device of claim 7 wherein the second semiconductor die directly overlies both the first metal layer portion and the second metal layer portion.

9. The power converter device of claim 7 wherein the second semiconductor die directly overlies the second metal layer portion and does not directly overlie the first metal layer portion.

10. The power converter device of claim 7 further comprising a die pad, wherein the first semiconductor die is interposed between the die pad and the second semiconductor die.

* * * * *